(12) United States Patent
Platt

(10) Patent No.: US 6,292,366 B1
(45) Date of Patent: Sep. 18, 2001

(54) PRINTED CIRCUIT BOARD WITH EMBEDDED INTEGRATED CIRCUIT

(75) Inventor: Richard Platt, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/603,795

(22) Filed: Jun. 26, 2000

(51) Int. Cl.[7] ................................................. H05K 7/20
(52) U.S. Cl. ............................ 361/700; 174/252; 361/764
(58) Field of Search ................................. 361/792, 795, 361/761, 762, 764, 697, 699, 700, 704, 705, 707, 722, 717–719; 174/252, 15.2; 165/80.3, 185, 104.33; 62/259.2; 257/713–715

(56) References Cited

U.S. PATENT DOCUMENTS

| | | | |
|---|---|---|---|
| 4,327,399 | * 4/1982 | Sasaki et al. | 361/698 |
| 4,631,636 | * 12/1986 | Andrews | 361/699 |
| 4,734,315 | * 3/1988 | Spence-Bate | 428/209 |
| 4,739,443 | * 4/1988 | Singhdeo | 361/689 |
| 4,774,630 | * 9/1988 | Reisman et al. | 361/718 |
| 5,199,165 | * 4/1993 | Crawford et al. | 29/846 |
| 5,306,866 | * 4/1994 | Gruber et al. | 174/15.1 |
| 5,355,942 | * 10/1994 | Conte | 165/104.33 |
| 5,793,611 | * 8/1998 | Nakazato et al. | 361/704 |

* cited by examiner

Primary Examiner—Gerald Tolin
(74) Attorney, Agent, or Firm—Mark Seeley

(57) ABSTRACT

A printed circuit board that includes first and second outer layers and a rigid core block that is positioned between those layers. An integrated circuit is positioned within the rigid core block and a heat pipe is formed within the rigid core block. The heat pipe is thermally coupled to the integrated circuit.

8 Claims, 6 Drawing Sheets

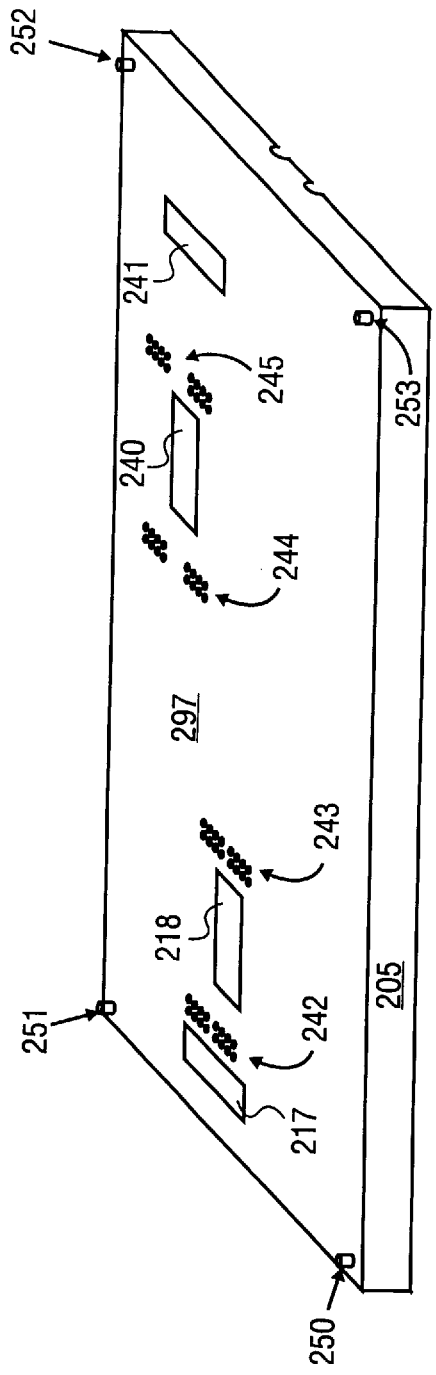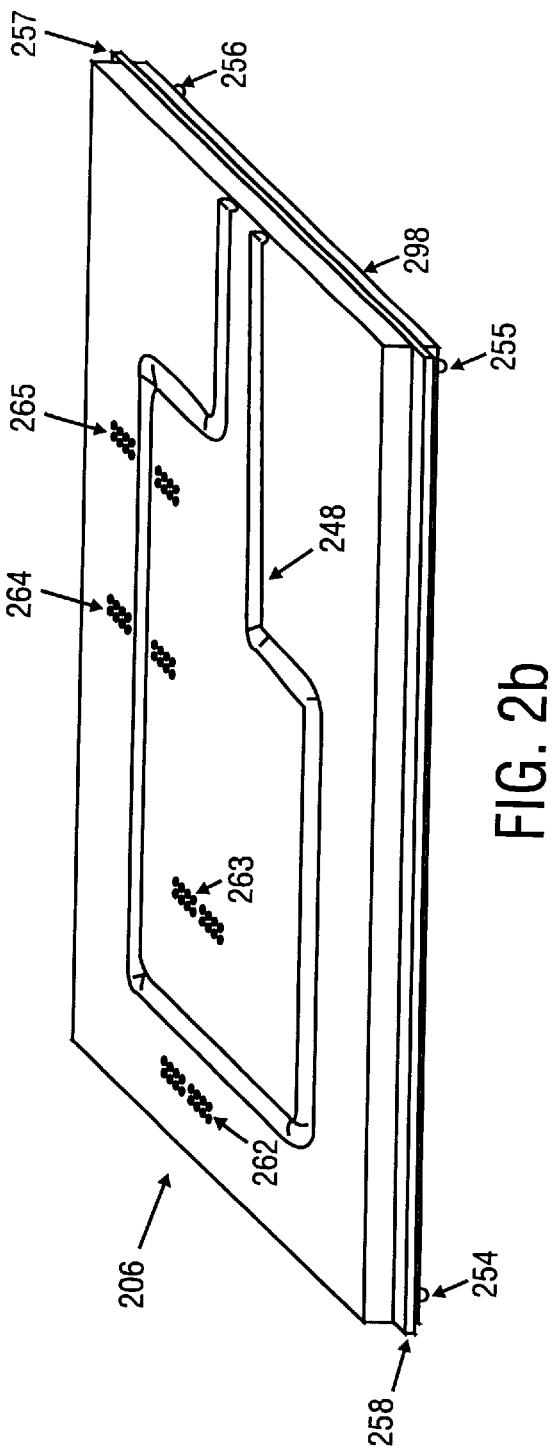

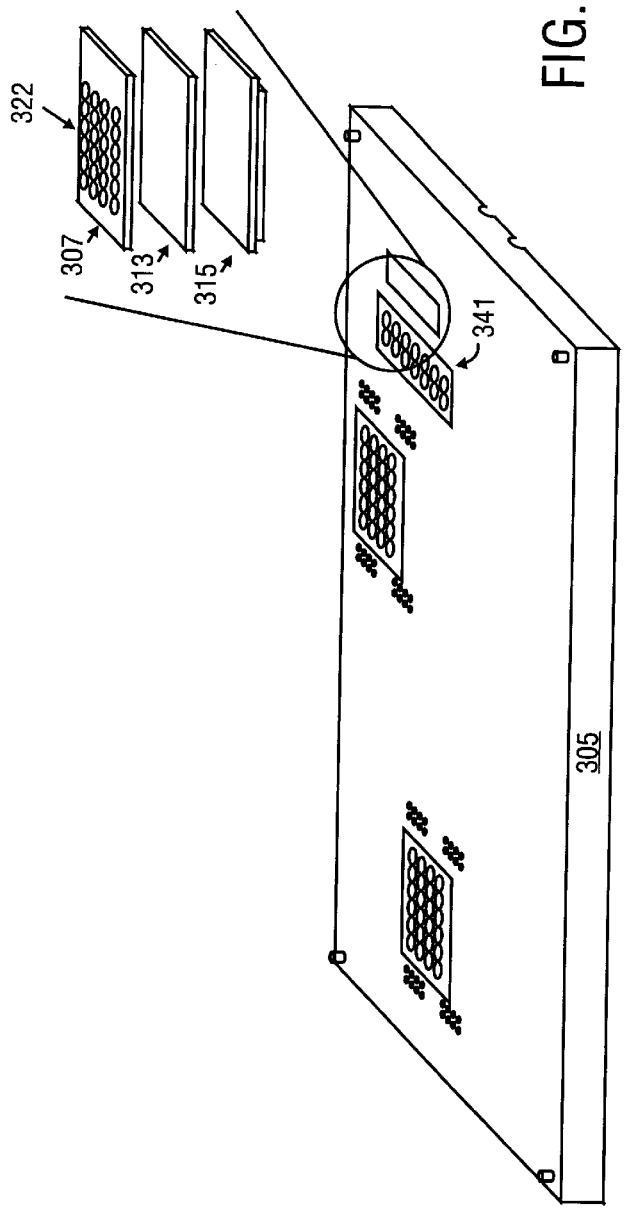
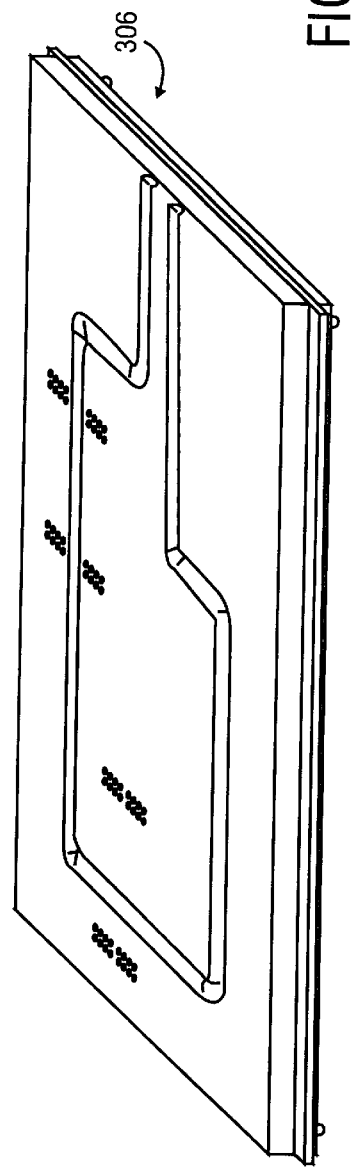
FIG. 3a
FIG. 3b

US 6,292,366 B1

PRINTED CIRCUIT BOARD WITH EMBEDDED INTEGRATED CIRCUIT

FIELD OF THE INVENTION

The present invention relates to printed circuit boards, e.g., those that include high density interconnects.

BACKGROUND OF THE INVENTION

Printed circuit boards ("PCBs") generally contain four or more layers, typically including at least one ground plane, a power plane and outer layers that provide a high density interconnect for coupling various components or sockets, which have been mounted to the PCB. Mounting components onto a PCB (or inserting them into a PCB socket) can be costly. Packaging such components (to protect them and to manage their environment) adds cost—as does adding certain devices to accommodate those components. For example, heavier components, e.g., microprocessors and their associated heat sinks, may require a retention module to secure them to the PCB. Heavy heat sinks may require use of PCB bracing elements. When components dissipate a significant amount of heat and/or cause electromagnetic interference ("EMI"), certain mechanisms may be required to address thermal and EMI issues.

Mounting packaged parts to a PCB may be undesirable for reasons other than cost. This practice exposes the components to the environment, which may increase their susceptibility to defects, and may require systems to adopt a relatively high profile. Also, mounting components to the PCB consumes PCB surface area that could otherwise be used for other purposes. In addition, for some components parasitic effects (which may result from the spacing between packaged die and associated PCB connections) may adversely affect electrical performance and signal integrity.

Accordingly, there is a need for an improved PCB that is less costly to make, when compared to those that receive certain packaged components. In particular, there is a need for such a PCB that addresses thermal, EMI, and stability requirements in a less costly fashion. There is a need for a PCB that need not allocate scarce surface area to certain packaged components, and that may facilitate relatively low profile systems. Furthermore, there is a need for a PCB that may protect the integrated circuits it contains, while reducing parasitic effects that are inherent in packaged devices. The present invention provides such a PCB.

BRIEF DESCRIPTION OF THE DRAWINGS

FIGS. 2a and 2b represent an embodiment of plates that may be used to form a rigid core block for the PCB illustrated in FIG. 1.

FIGS. 3a and 3b illustrate how cavities formed in the plates shown in FIGS. 2a and 2b may receive certain integrated circuits.

DETAILED DESCRIPTION OF THE PRESENT INVENTION

A printed circuit board ("PCB") is described. That PCB includes first and second outer layers, and a rigid core block that is positioned between the first outer layer and the second outer layer. The PCB includes an integrated circuit that is positioned within the rigid core block, and a heat pipe that is formed within the rigid core block. The heat pipe is thermally coupled to the integrated circuit.

In the following description, specific details are set forth such as component and material types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
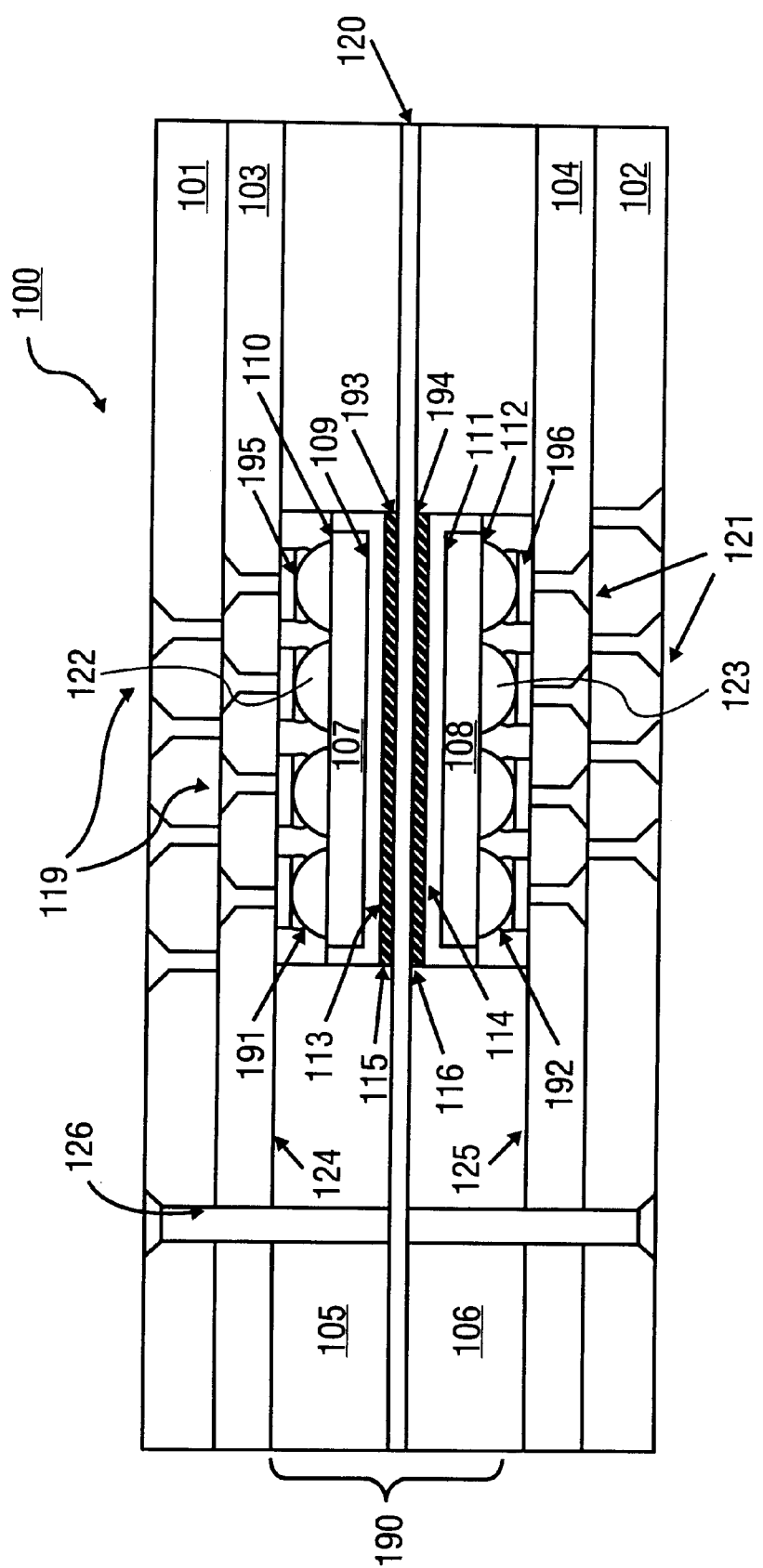
FIG. 1 represents a cross-section of an embodiment of the PCB of the present invention.

As shown in FIG. 1, in one embodiment of the present invention PCB 100 comprises first outer layer 101, second outer layer 102, first inner layer 103, and second inner layer 104. (Although this embodiment portrays a four layer PCB, the present invention may apply to PCBs that have a different number of layers.) Rigid core block 190, which in this embodiment comprises plates 105 and 106, is formed between layers 103 and 104. Rigid core block 190 includes cavities for receiving integrated circuits ("ICs") 107 and 108, enabling those ICs to be embedded between outer layers 101 and 102. Block 190 also includes heat pipe 120, which is thermally coupled to both IC 107 and IC 108.

First IC 107 includes first surface 109 and second surface 110. Second IC 108 includes first surface 111 and second surface 112. First stress absorbing layer 113 is formed on first surface 109 of IC 107, and second stress absorbing layer 114 is formed on first surface 111 of IC 108. First thermally conductive layer 115 is formed on first stress absorbing layer 113, and second thermally conductive layer 116 is formed on second stress absorbing layer 114. Heat pipe 120 is thermally coupled to first thermally conductive layer 115 and second thermally conductive layer 116.

PCB 100 also includes a first plurality of micro vias 119 that electrically couple second surface 110 of IC 107 to first outer layer 101, and a second plurality of micro vias 121 that electrically couple second surface 112 of IC 108 to second outer layer 102. (Vias 126 are used to route signals from one PCB layer to another in the conventional manner.) In addition, first layer of thermally conductive grease 193 is formed between first thermally conductive layer 115 and heat pipe 120, and second layer of thermally conductive grease 194 is formed between second thermally conductive layer 116 and heat pipe 120.

First outer layer 101 and second outer layer 102 may comprise dielectric layers used to form high density interconnect PCBs. Certain portions of those layers are excised, and conductive material is deposited on others, to generate the desired interconnect and mounting surfaces for the PCB. Because materials that may be used to form such layers are well known to those skilled in the art, they will not be listed here. Likewise, first inner layer 103 and second inner layer 104 may be made from conventionally used dielectric materials. In this embodiment of the present invention, contact pads 195 and 196 are formed on layers 103 and 104, respectively, to connect those layers to ICs 107 and 108. In addition to forming traces on outer layers 101 and 102, traces can be routed out on inner layers 103 and 104.

Rigid core block 190 is preferably made from a material that can strengthen and stabilize PCB 100 to reduce flexibility (that may cause undesirable warping or bending) and susceptibility to cracking. Materials that may be used to form rigid core block 190 include aluminum, or an aluminum containing alloy, e.g., a magnesium/aluminum alloy. Although aluminum containing materials may be preferred, other metals or other materials that can produce a rigid block may be used instead.

ICs 107 and 108 may generate significant quantities of heat or produce significant electromagnetic emissions. For example, ICs 107 and 108 may comprise microprocessors, other types of logic devices (e.g., chipsets, DSPs, various types of controllers, etc. . . . ), ASICs, or memory devices. In this embodiment of the present invention, IC 107 and IC 108 each include a plurality of bump contact pads 122 and 123, respectively. Bump contact pads 122 engage contact pads 195, which have been imprinted onto bottom surface 124 of first inner layer 103, and bump contact pads 123 engage contact pads 196, which have been imprinted onto bottom surface 125 of second inner layer 104. In this way, bump contact pads 122 and 123 are coupled to micro vias 119 and 121, respectively, by contact pads 195 and 196. Conductive adhesive 191 bonds pads 122 of IC 107 to pads 195 of first inner layer 103, and conductive adhesive 192 bonds pads 123 of IC 108 to pads 196 of second inner layer 104. Note that in this embodiment, ICs 107 and 108 are aligned with each other.

Stress absorbing layers 113 and 114 act as buffers to reduce adverse effects that may result from mismatch between ICs 107 and 108's coefficient of thermal expansion and modulus of elasticity and those of adjacent components (e.g., thermally conductive layers 115 and 116 and rigid core block 190). To provide this benefit, note that stress absorbing layer 113 is formed between surface 109 and thermally conductive layer 115, and also between opposing sides of IC 107 and plate 105. Similarly, stress absorbing layer 114 is formed between surface 111 and thermally conductive layer 116, and also between opposing sides of IC 108 and plate 106. Various types of resins and epoxies may be used to make stress absorbing layers 113 and 114. Particularly preferred are silver containing resins or epoxies. Thermally conductive layers 115 and 116 are preferably made from a thermally conductive material, such as copper, that enables heat transfer between ICs 107 and 108 and heat pipe 120. Although copper may be a preferred material for making layers 115 and 116, other thermally conductive materials may be used instead.

Heat pipe 120 enables heat to be transferred from ICs 107 and 108 to a heat sink. In that respect, heat pipe 120 serves the same heat transfer function that similar structures perform in other apparatus. In a preferred embodiment, heat pipe 120 contains a fluid that absorbs heat near ICs 107 and 108. This creates a pressure differential that causes warm fluid to flow toward a cooler portion of the heat pipe, e.g., a section that is coupled to a heat sink. Exposure to the environment via such a heat sink (over which a fan may drive cool air) enables heat to dissipate from the heat pipe fluid. The cooled fluid then circulates back to ICs 107 and 108. The appropriate types of fluid that may be used in heat pipe 120 will be apparent to those skilled in the art.

Micro vias 119 and 121 preferably have a diameter that is significantly smaller than the diameter of vias 126. If, for example, via 126 has a diameter of about 0.01 inches, then micro vias 119 and 121 may have diameters between about 0.004 and about 0.006 inches. Materials used to fill micro vias 119 and 121 preferably comprise conductive materials, such as those that are generally used to produce an interconnect to couple devices. Copper is generally preferred, but other materials may be used as well. Likewise, the conductive adhesive for bonding pads 122 and 123 to pads 195 and 196, and the thermally conductive grease for sealing thermally conductive layers 115 and 116 to heat pipe 120 may comprise conventionally used materials—as will be apparent to those skilled in the art.

Although contact pads 122 and 123 preferably comprise gold bumps, they may be shaped differently from the shapes depicted here, may instead comprise wire contacts, or may be formed from a material other than gold. In this respect, the shape and type of contacts used, as well as the material used to make them, is unimportant as long as they serve to connect the ICs with the micro vias, and/or traces routed out on the inner layers. Similarly, the shape and type of contacts used for contacts 195 and 196, as well as the material used to make them, is unimportant as long as they serve their intended function.

In the embodiment shown in FIG. 1, plate 105 and the components enclosed within it provides, in essence, a mirror image of plate 106 and the components it contains. Although these components may be arranged in that fashion, alternative embodiments may comprise a rigid core block that contains only a single embedded IC, or that contains different types and numbers of embedded ICs from those shown in FIG. 1. Nor do such ICs have to be aligned with each other. In that respect, the present invention is not limited by the number or type of ICs that are embedded in the PCB, nor by how those ICs are arranged with respect to each other.

FIGS. 2–6 illustrate how various components are assembled to produce the PCB represented by FIG. 1. Starting with FIGS. 2a and 2b, rigid core block 190 is formed from plates 205 and 206. In this embodiment, cavities 217, 218, 240 and 241 are formed in plate 205. Similar cavities (not shown) may be formed in slab 206. Those cavities will receive integrated circuits. Sets of cylindrically shaped holes 242, 243, 244, 245, 262, 263, 264 and 265 are also formed. Those holes, which form the portion of vias 126 that passes through the rigid core block, may be drilled through plates 205 and 206, and subsequently filled with conductive material to enable signals to be routed from one PCB layer to another.

As shown in FIG. 2b, cavity 248 is formed in plate 206. That cavity, together with a corresponding cavity that is formed in plate 205 (not shown), will create a heat pipe when plates 205 and 206 are joined to form rigid core block 190. These various cavities and holes may be formed in plates 205 and 206 using conventional micro-machining or molding processes. Side 297 of plate 205, and the underside of plate 206, may be coated with an insulating material (e.g., a polyimide based laminate or other dielectric material) to prevent electrical shorts between rigid core block 190 and adjoining PCB layers.

In addition to the various cavities and holes formed in plates 205 and 206, those plates include alignment pins 250, 251, 252, 253, 254, 255, and 256 (and another on plate 206, which is not shown) for proper registration with PCB layers to be fixed to them. Retainer rails 257 and 258 are formed on plate 206 to enable PCB 100 to be mounted to a chassis, e.g., by sliding rails 257 and 258 into corresponding slots formed in a chassis' side walls.

As shown in FIGS. 3a and 3b, various integrated circuits may be inserted into the cavities formed in plates 305 and 306. FIG. 3 illustrates, for example, how thermally conductive layer 315, stress absorbing layer 313, and IC 307 may be stacked within cavity 341. IC 307 includes bump contact pads 322, e.g., conventional gold contact pads, which may be formed on IC 307 in the conventional manner.

Figure 4:
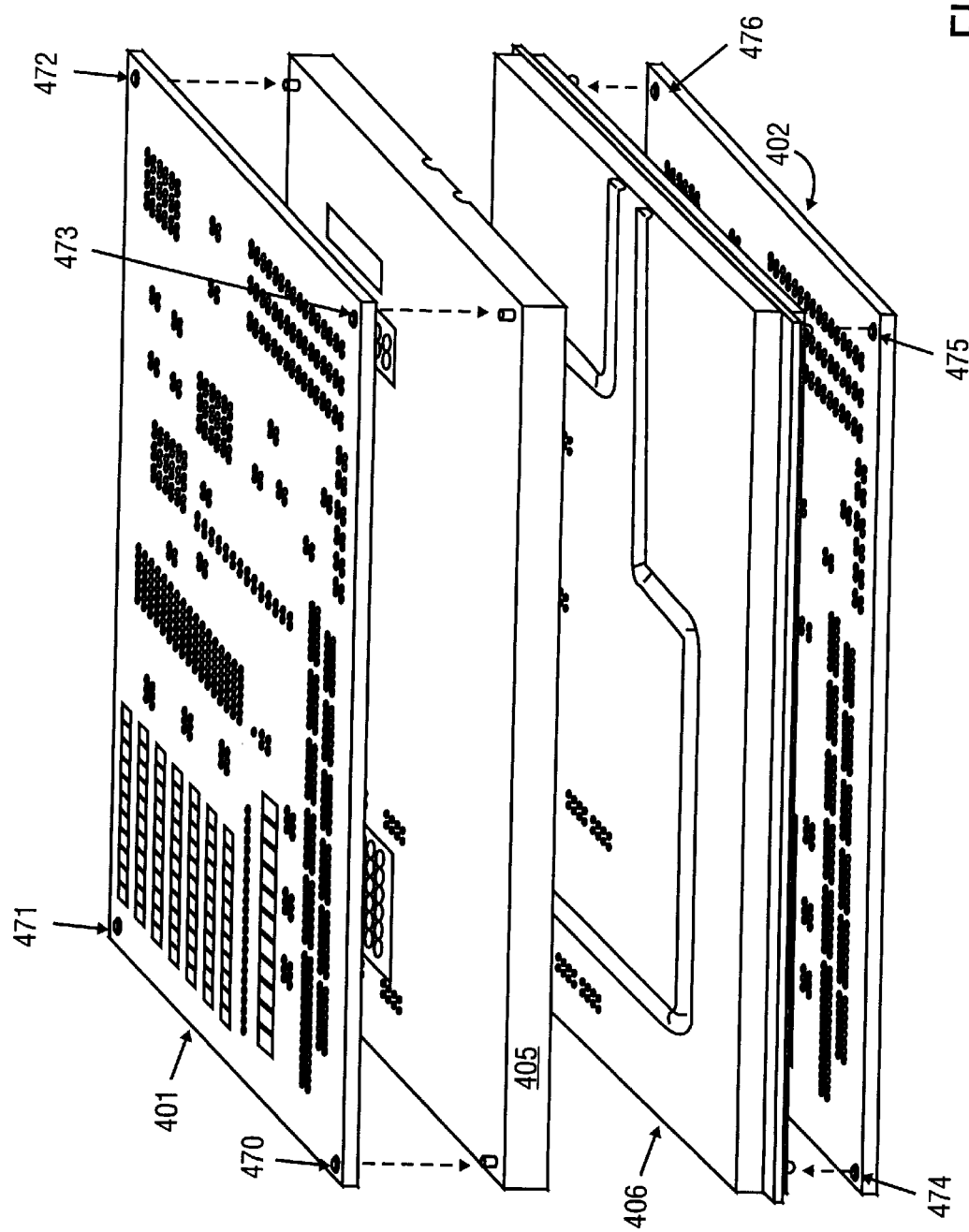
FIG. 4 is an exploded view that illustrates how outer layers may be combined with a rigid core block to form the PCB of FIG. 1.

After the ICs are inserted into the appropriate cavities, outer layers 401 and 402 may be mounted to plates 405 and 406, respectively—as shown in FIG. 4. (Those outer layers may be formed on one or more inner layers, as is well known to those skilled in the art.) Outer layers 401 and 402 provide the high density interconnect that will enable signals to be transmitted between components that will be mounted to those layers. The desired layout and interconnect for PCB 100 may be fixed into outer layers 401 and 402 using conventional techniques. Because materials and methods for making such layers are well known to those skilled in the art, they will not be described here.

Outer layers 401 and 402 include registration holes 470, 471, 472, 473, 474, 475, and 476 (and another on layer 402, which is not shown). To secure outer layers 401 and 402 to plates 405 and 406, those registration holes slide over their corresponding alignment pins, when those outer layers are positioned onto those plates.

Figure 5:
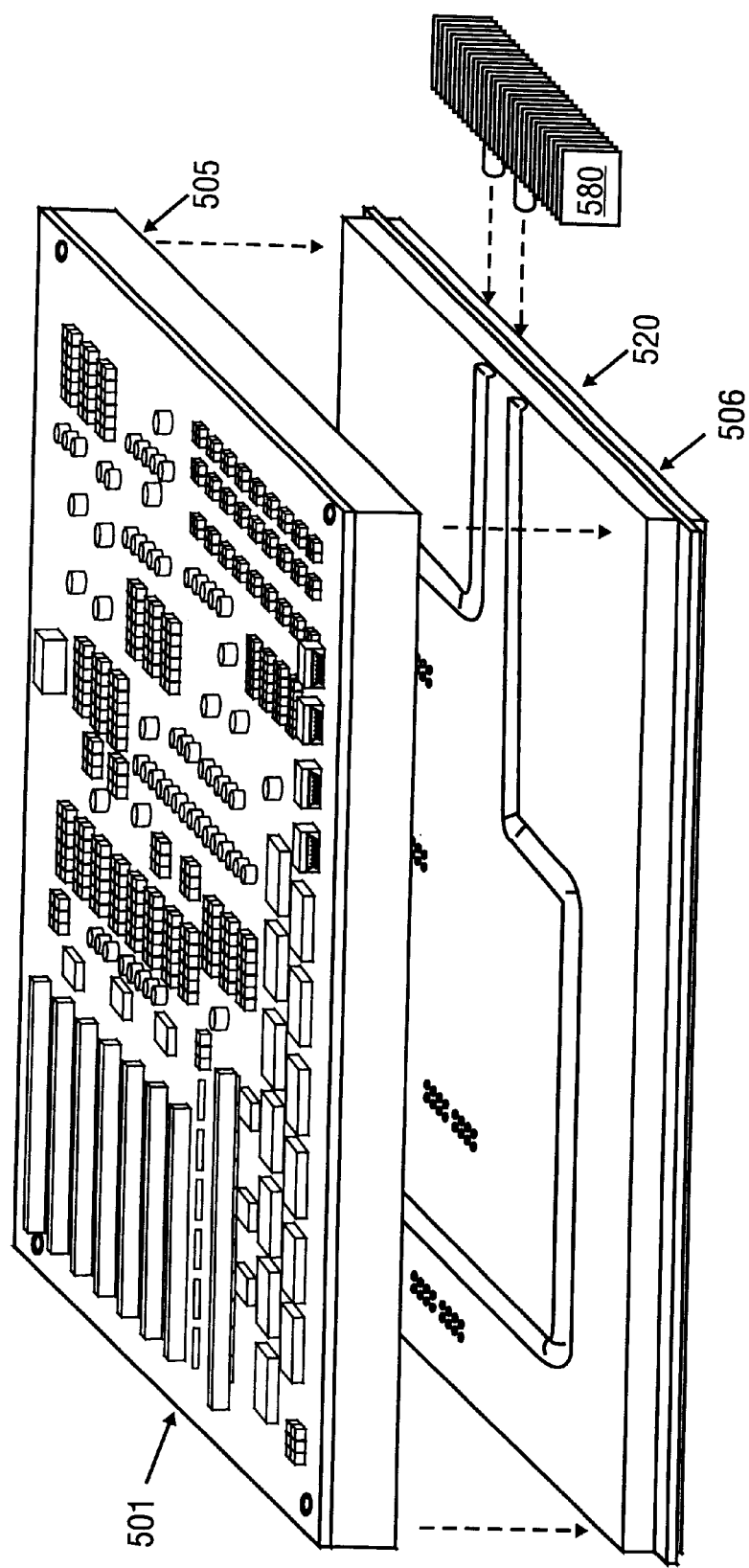
FIG. 5 illustrates mounting certain components onto an outer layer of the assembly shown in FIG. 4.
Figure 6:
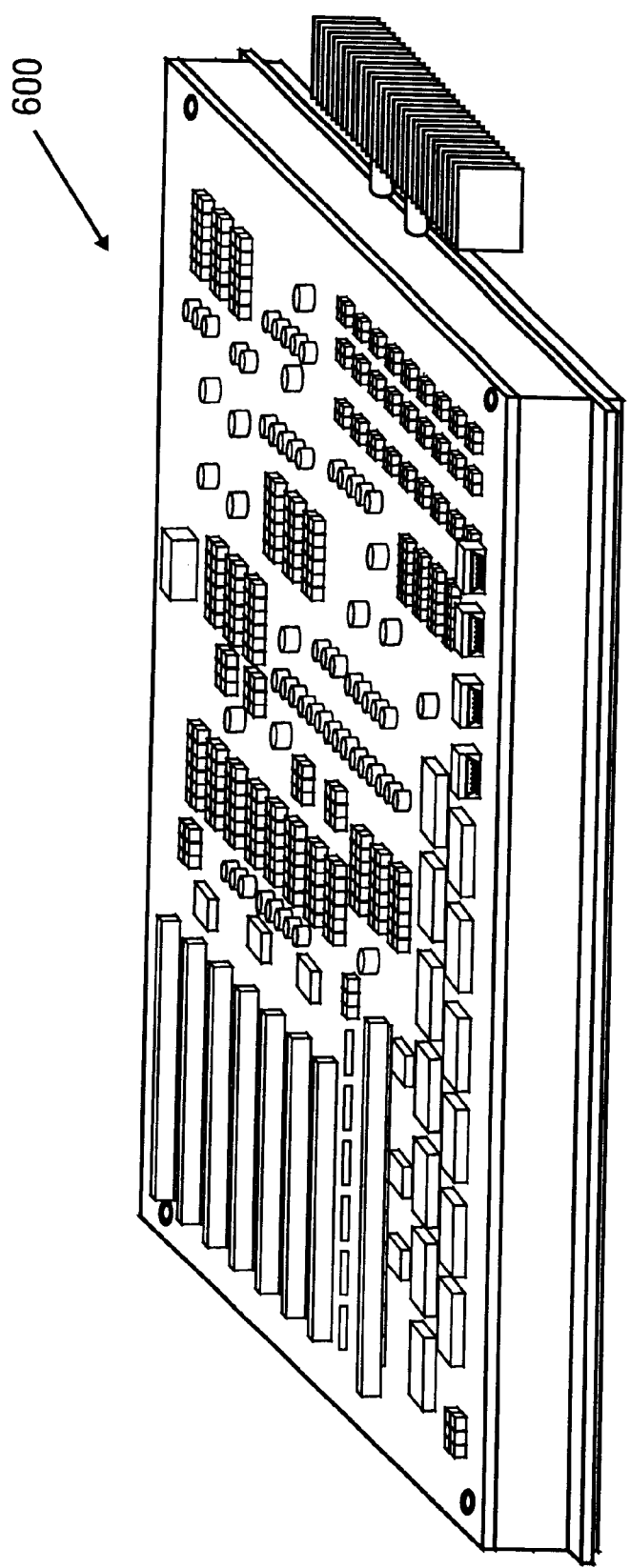
FIG. 6 is a perspective view of the PCB illustrated in FIG. 1.

At this point, surface mounted components may be coupled to outer layer 501, as shown in FIG. 5. (Other surface mounted components, which are not shown, may be mounted to the outer layer formed on plate 506.) Those surface mounted components comprise devices that are conventionally mounted to PCBs. Such devices include, for example, various types of memory devices, controllers (e.g., for handling graphics, audio, networking, I/O, and data exchange with various storage devices), clock ICs, components for delivering and distributing power, surface mounted connectors for receiving various devices, etc. . . . Heat pipe 520 will be formed when plates 505 and 506 are joined to form rigid core block 190, and heat sink 580 will be coupled to that heat pipe. When assembled, PCB 600 appears as shown in FIG. 6.

An improved PCB has been described. That PCB may be used in various types of computer, networking, and communication devices, e.g., servers, desktop PCs, notebook PCs, laptop PCs, PDAs and other handheld devices, switches, routers, hubs, etc. . . . By embedding one or more ICs within the rigid core, the resulting PCB may be easily manufactured in a very cost effective manner. Embedding ICs dispenses with the need to package them, as the PCB itself serves the protective packaging function. Nor are retention devices needed. By embedding EMI causing components, the PCB and rigid core suppress electromagnetic emissions, eliminating the need for costly EMI reduction mechanisms. Another cost savings benefit results from application of a relatively inexpensive thermal solution.

Non-cost related benefits include: enabling lower profile systems (which could enable thinner servers and laptop computers, for example); accommodating more PCB mounted components, as embedding certain components frees up PCB space; and improving electrical performance and signal integrity. Such improved performance may result when parasitic effects, which packaging may cause, are eliminated by embedding ICs into the PCB. Such integration may also enhance quality and reliability, as embedding the ICs makes them less susceptible to defects. Another advantage that the present invention provides relates to the stabilizing effect that the rigid core provides to the PCB.

Features shown in the above referenced drawings are not intended to be drawn to scale, nor are they intended to be shown in precise positional relationship. Additional components that the PCB may contain have been omitted as they are not useful to describe aspects of the present invention.

Although the foregoing description has specified a PCB that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A printed circuit board comprising:

first and second outer layers;

a rigid core block positioned between the first outer layer and the second outer layer;

an integrated circuit, which has a first surface and a second surface, that is positioned within the rigid core block, the integrated circuit including a plurality of contact pads that are coupled to a plurality of micro vias that electrically couple the second surface of the integrated circuit to the first outer layer;

a stress absorbing layer comprising silver formed on the first surface of the integrated circuit;

a thermally conductive layer comprising copper formed on the stress absorbing layer; and a heat pipe, formed within the rigid core block, that is thermally coupled to the integrated circuit.

2. The printed circuit board of claim 1 further comprising:

an inner layer positioned between the rigid core block and the first outer layer, the inner layer including a plurality of contact pads that couple the plurality of micro vias to the plurality of contact pads that are formed on the integrated circuit;

a conductive adhesive that attaches the plurality of integrated circuit contact pads to the inner layer's plurality of contact pads; and a layer of thermally conductive grease that is formed between the thermally conductive layer and the heat pipe.

3. A printed circuit board comprising:

first and second outer layers;

an inner layer;

a rigid core block positioned between the inner layer and the second outer layer, the inner layer formed between the rigid core block and the first outer layer;

the rigid core block including a first cavity for receiving an integrated circuit and a second cavity that forms a heat pipe;

an integrated circuit, which has a first surface and a second surface, that is placed within the first cavity and that is thermally coupled to the heat pipe;

an epoxy layer formed on the first surface of the integrated circuit;

a thermally conductive layer formed on the epoxy layer, the thermally conductive layer coupling the integrated circuit to the heat pipe; and a plurality of micro vias that electrically couple the second surface of the integrated circuit to the first outer layer.

4. The printed circuit board of claim 3 wherein the inner layer includes a plurality of contact pads, a first side of which are coupled to the plurality of micro vias; and the integrated circuit includes a plurality of bump contact pads that are coupled to a second side of the inner layer's contact pads.

5. A printed circuit board comprising:

first and second outer layers;

first and second inner layers;

a rigid core block, which is positioned between the first and second inner layers, the first inner layer formed between the rigid core block and the first outer layer, and the second inner layer formed between the rigid core block and the second outer layer;

the rigid core block including a first cavity for receiving a first integrated circuit and a second cavity for receiving a second integrated circuit;

a first integrated circuit, which has a first surface and a second surface, that is positioned within the first cavity;

a second integrated circuit, which has a first surface and a second surface, that is positioned within the second cavity;

a heat pipe, formed within the rigid core block, that is thermally coupled to both the first integrated circuit and the second integrated circuit;

a first epoxy layer formed on the first surface of the first integrated circuit;

a second epoxy layer formed on the first surface of the second integrated circuit;

a first thermally conductive layer formed on the first epoxy layer and a second thermally conductive layer formed on the second epoxy layer, the first thermally conductive layer coupling the heat pipe to the first integrated circuit and the second thermally conductive layer coupling the heat pipe to the second integrated circuit;

a first plurality of micro vias that electrically couple the second surface of the first integrated circuit to the first outer layer; and a second plurality of micro vias that electrically couple the second surface of the second integrated circuit to the second outer layer.

6. The printed circuit board of claim 5 wherein the first surface of the first integrated circuit is aligned with the first surface of the second integrated circuit, the first integrated circuit including a plurality of bump contact pads that are coupled to the first plurality of micro vias by a plurality of contact pads that are formed on the first inner layer, and the second integrated circuit including a plurality of bump contact pads that are coupled to the second plurality of micro vias by a plurality of contact pads that are formed on the second inner layer.

7. The printed circuit board of claim 6 wherein the first and second epoxy layers each comprise silver, and the first and second thermally conductive layers each comprise copper.

8. The printed circuit board of claim 7 further comprising:

a conductive adhesive that attaches the plurality of contact pads formed on the first integrated circuit to the plurality of contact pads formed on the first inner layer;

a conductive adhesive that attaches the plurality of contact pads formed on the second integrated circuit to the plurality of contact pads formed on the second inner layer;

a first layer of thermally conductive grease that is formed between the first thermally conductive layer and the heat pipe; and a second layer of thermally conductive grease that is formed between the second thermally conductive layer and the heat pipe.

* * * * *